United States Patent
Nulty

(10) Patent No.: US 10,203,355 B2
(45) Date of Patent: Feb. 12, 2019

(54) POWER EXTRACTION FOR A MEDIUM VOLTAGE SENSOR USING A CAPACITIVE VOLTAGE DIVIDER

(71) Applicant: Aclara Technologies LLC, Hazelwood, MO (US)

(72) Inventor: Gregory M. Nulty, Reston, VA (US)

(73) Assignee: ACLARA TECHNOLOGIES LLC, St. Louis, MO (US)

( * ) Notice: Subject to any disclaimer, the term of this patent is extended or adjusted under 35 U.S.C. 154(b) by 505 days.

(21) Appl. No.: 14/839,570

(22) Filed: Aug. 28, 2015

(65) Prior Publication Data

US 2016/0061862 A1 Mar. 3, 2016

Related U.S. Application Data

(60) Provisional application No. 62/043,640, filed on Aug. 29, 2014.

(51) Int. Cl.
| | |
|---|---|
| *G01R 15/06* | (2006.01) |
| *G01R 19/00* | (2006.01) |
| *G01R 15/16* | (2006.01) |
| *G01R 15/14* | (2006.01) |
| *G01R 21/133* | (2006.01) |

(52) U.S. Cl.
CPC .......... *G01R 15/06* (2013.01); *G01R 15/142* (2013.01); *G01R 15/16* (2013.01); *G01R 21/133* (2013.01)

(58) Field of Classification Search
CPC ...... G01R 15/06; G01R 15/16; G01R 15/142; G01R 21/133
See application file for complete search history.

(56) References Cited

U.S. PATENT DOCUMENTS

| 3,777,217 A | 12/1973 | Groce et al. |
| 4,420,752 A | 12/1983 | Davis et al. |
| (Continued) | | |

FOREIGN PATENT DOCUMENTS

| EP | 0 026 801 A1 | 4/1981 |
| EP | 1 505 706 A2 | 2/2005 |
| (Continued) | | |

OTHER PUBLICATIONS

International Preliminary Report on Patentability and Written Opinion for Application No. PCT/US2012/067285 dated Jun. 12, 2014.
(Continued)

*Primary Examiner* — Patrick Assouad
*Assistant Examiner* — Haidong Zhang
(74) *Attorney, Agent, or Firm* — Polsinelli PC

(57) ABSTRACT

A sensor unit coupled to a first wire of a power line for measuring power-related parameters of the power line. The sensor unit contains a first capacitor and makes voltage measurements relative to another wire, to which the sensor unit is coupled by a second capacitor. The captors form a voltage divider such that the sensor unit may measure a voltage in a range much lower than the voltage on the power line. Additionally, the capacitive voltage divider yields a voltage that can be used to power the sensor unit, including by charging an energy storage device. The sensor unit may also supply power to other nearby devices, such as other devices that form a mesh sensor network.

24 Claims, 9 Drawing Sheets

(56) References Cited

U.S. PATENT DOCUMENTS

| | | |
|---|---|---|
| 4,581,606 A | 4/1986 | Mallory |
| 4,689,752 A | 8/1987 | Fernandes et al. |
| 4,709,339 A | 11/1987 | Fernandes |
| 4,728,887 A | 3/1988 | Davis |
| 4,801,937 A | 1/1989 | Fernandes |
| 4,808,917 A | 2/1989 | Fernandes et al. |
| 4,829,298 A | 5/1989 | Fernandes |
| 5,006,846 A | 4/1991 | Granville et al. |
| 5,235,861 A | 8/1993 | Seppa |
| 5,426,360 A | 6/1995 | Mario et al. |
| 5,684,507 A | 11/1997 | Rasnake et al. |
| 5,684,508 A | 11/1997 | Brilman |
| 5,684,710 A | 11/1997 | Ehlers et al. |
| 5,708,679 A | 1/1998 | Fernandes et al. |
| 5,715,058 A | 2/1998 | Bohnert et al. |
| 5,729,144 A | 3/1998 | Cummins |
| 5,995,911 A | 11/1999 | Hart |
| 6,005,759 A | 12/1999 | Hart et al. |
| 6,205,867 B1 | 3/2001 | Hayes et al. |
| 6,301,514 B1 | 10/2001 | Canada et al. |
| 6,535,797 B1 | 3/2003 | Bowles et al. |
| 6,597,180 B1 | 7/2003 | Takaoka et al. |
| 6,660,934 B1 | 12/2003 | Nourai et al. |
| 6,751,562 B1 | 6/2004 | Blackett et al. |
| 6,940,702 B2 | 9/2005 | Kojovic et al. |
| 7,135,580 B2 | 3/2006 | Bonrath et al. |
| 7,058,524 B2 | 6/2006 | Hayes et al. |
| 7,075,308 B2 | 7/2006 | Rockwell |
| 7,135,850 B2 | 7/2006 | Ramirez |
| 7,468,661 B2 | 12/2008 | Petite et al. |
| 7,714,735 B2 | 5/2010 | Rockwell |
| 7,987,071 B1 | 7/2011 | Dorfman et al. |
| 8,103,466 B2 | 1/2012 | Taft |
| 8,536,857 B2* | 9/2013 | Nero, Jr. .............. G01R 15/142 324/117 H |
| 8,587,445 B2 | 11/2013 | Rockwell |
| 8,896,291 B2 | 11/2014 | Nero, Jr. |
| 8,941,491 B2 | 1/2015 | Polk et al. |
| 9,069,009 B2 | 6/2015 | Nero, Jr. |
| 9,158,036 B2 | 10/2015 | Liu et al. |
| 2002/0038199 A1 | 3/2002 | Blemel |
| 2003/0161084 A1 | 8/2003 | Potts et al. |
| 2003/0216876 A1 | 11/2003 | Premeriani et al. |
| 2004/0169171 A1 | 9/2004 | Reeves et al. |
| 2005/0017751 A1 | 1/2005 | Gunn et al. |
| 2005/0145018 A1 | 7/2005 | Sabata et al. |
| 2005/0151659 A1 | 7/2005 | Donovan et al. |
| 2005/0191647 A1 | 9/2005 | Kunsman et al. |
| 2006/0056370 A1 | 3/2006 | Hancock et al. |
| 2006/0077918 A1 | 4/2006 | Mao et al. |
| 2006/0275532 A1 | 12/2006 | Dechert |
| 2007/0059986 A1 | 3/2007 | Rockwell |
| 2008/0036620 A1 | 2/2008 | McCollough |
| 2008/0106241 A1* | 5/2008 | Deaver ............... H02J 3/1828 323/209 |
| 2009/0027932 A1 | 1/2009 | Haines et al. |
| 2009/0138229 A1 | 5/2009 | Engelhardt et al. |
| 2009/0243876 A1 | 10/2009 | Lilien et al. |
| 2010/0013457 A1 | 1/2010 | Nero, Jr. |
| 2010/0114392 A1 | 5/2010 | Lancaster |
| 2010/0152910 A1 | 6/2010 | Taft |
| 2010/0156441 A1* | 6/2010 | Moliton ............... G01R 15/06 324/681 |
| 2010/0188239 A1 | 7/2010 | Rockwell |
| 2010/0237852 A1 | 9/2010 | Tazzari et al. |
| 2011/0082596 A1 | 4/2011 | Meagher et al. |
| 2011/0187578 A1 | 8/2011 | Farneth et al. |
| 2011/0238374 A1 | 9/2011 | Lancaster |
| 2011/0282508 A1 | 11/2011 | Goutard et al. |
| 2011/0288777 A1 | 11/2011 | Gupta |
| 2012/0029871 A1 | 2/2012 | Spillane |
| 2012/0046799 A1 | 2/2012 | Alex et al. |
| 2012/0278011 A1 | 11/2012 | Lancaster |
| 2013/0054162 A1 | 2/2013 | Smith et al. |
| 2013/0054183 A1 | 2/2013 | Afzal et al. |
| 2013/0134998 A1 | 5/2013 | Kiko et al. |
| 2013/0205900 A1* | 8/2013 | Nulty ............... H02J 3/00 73/514.01 |
| 2013/0328546 A1 | 12/2013 | Nero, Jr. |
| 2014/0052388 A1 | 2/2014 | Mahlen et al. |
| 2014/0136140 A1 | 5/2014 | Chan et al. |
| 2014/0143578 A1 | 5/2014 | Cenizal et al. |
| 2014/0163884 A1 | 6/2014 | Lilien et al. |
| 2014/0288863 A1 | 9/2014 | Stevenin |
| 2014/0368215 A1* | 12/2014 | Hoffman .............. G01R 15/16 324/552 |
| 2015/0069998 A1 | 3/2015 | Nero, Jr. |
| 2015/0276818 A1 | 10/2015 | Nulty |
| 2015/0331017 A1* | 11/2015 | Raghunathan ..... G01R 19/0084 324/754.27 |
| 2016/0061862 A1 | 3/2016 | Nulty |

FOREIGN PATENT DOCUMENTS

| | | |
|---|---|---|
| EP | 2 081 273 A2 | 7/2009 |
| GB | 367 244 A | 2/1932 |
| GB | 1 501 351 A | 2/1978 |
| JP | 2004/168914 A | 6/1992 |
| JP | 2006/102308 A | 4/1994 |
| JP | 2010/054863 | 2/1998 |
| WO | WO 99/42844 A1 | 8/1999 |
| WO | WO 00/60367 A1 | 10/2000 |
| WO | WO 01/09628 A1 | 2/2001 |
| WO | WO 2004/068151 A1 | 8/2004 |
| WO | WO 2005/019846 A1 | 3/2005 |
| WO | WO 2005/067686 A2 | 7/2005 |
| WO | WO 2005/091958 A2 | 10/2005 |
| WO | WO 2006/021030 A1 | 3/2006 |
| WO | WO 2006/031739 A2 | 3/2006 |
| WO | WO 2006/092632 A2 | 9/2006 |
| WO | WO 2007/134022 A2 | 11/2007 |
| WO | WO 2009/120537 A1 | 10/2009 |
| WO | WO 2010/127145 A1 | 4/2010 |
| WO | WO 2011/000754 A1 | 1/2011 |
| WO | WO 2013/033387 A1 | 3/2013 |
| WO | WO 2013/076975 A1 | 5/2013 |
| WO | WO 2014/088562 A1 | 6/2014 |
| WO | WO 2014/105018 A2 | 7/2014 |
| WO | WO 2014105018 A2 * | 7/2014 ............. G01R 21/06 |

OTHER PUBLICATIONS

International Preliminary Report on Patentability for Application PCT/US2013/025946 dated Aug. 28, 2014.
International Preliminary Report on Patentability for Application No. PCT/US2012/053106 dated Mar. 13, 2014.
International Preliminary Report on Patentability for Application No. PCT/US2012/053125 dated Mar. 13, 2014.
International Search Report and Written Opinion for Application No. PCT/US2012/053106 dated Jan. 4, 2013.
International Search Report and Written Opinion for Application No. PCT/US2012/053125 dated Jan. 4, 2013.
International Search Report and Written Opinion for Application No. PCT/US2012/067285 dated Mar. 27, 2013.
International Search Report and Written Opinion for Application No. PCT/US2015/023467 dated Oct. 5, 2015.
International Search Report and Written Opinion for Application No. PCT/US2015/047404 dated Dec. 10, 2015.
International Search Report and Written Opinion for International Application No. PCT/US2013/025946, dated May 29, 2013.
ABB Improves Grid Reliability in Algeria, Jun. 13, 2006. http://www.abb.com/cawp/seitp202/d18e8cf73169fbc125714900427925.aspx?
Brambley et al., Wireless Sensor Applications for Buildings Operation and Management. Http://www.buildingsystemsprogram.pnl.gov/wireless/publications/pnnl-sa-43465.pdf. 2005. 40 pages.
Cooper Power Systems, S.T.A.R. Faulted Circuit Indicators, Bulletin No. 98025, Jun. 1998.
Doig et al., Reclassification of Relay-Class Current Transformers for Revenue Metering Applications, © 2005 IEEE Reprinted from the proceeding of the IEEE T&D PES Conference 1-8.

(56) References Cited

OTHER PUBLICATIONS

Govindarasu et al., SST-Sensor Network Design for a Secure National Electric Energy Infractructure, Iowa State University, Department of Electrical Engineering, 2004. http://www.eng.iastate.edu/abstractsvieewabstract.asp?id=1920.

GridSense website http://www.gridsense.net/products_It30.shtml Aug. 9, 2006.

Hacker et al., Securing America's Power Grid. Iowa State University News Service Relations, 2006. http://www.iastate/edu~nscentral//news/2006/jun/grid.shtml.

Nordman et al., Design of a Concept and a Wireless ASIC Sensor for Locating Earth Faults in Unearthed Electrical Distribution Networks, IEEE Transactions on Power Delivery. 2006;21(3):1074-82.

Nordman, An Architecture for Wireless Sensors in Distributed Management of Electrical Distribution Systems. Helsinki University of Technology. 1-69. Http://lib.tkk.fi/Diss/2004/isbn9512272989.pdf.

Ozaki et al., A Fault-Tolerant Model for Wireless Sensor-Actor System, IEEE Computer Society, Proceedings of 20th International Conference on Advance Information Networking and Applications. 2006;1-5.

Poisson et al., Detection and measurement of power quality disturbances using wavelet transform. IEEE Transactions of Power Delivery. Jul. 2000;15(3):1039-44.

Risley et al., Electronic Security Risks Associated With Use of Wireless, Point-To-Point Communications in the Electric Power Industry, 2003;1-16.

Santoso et al., Power quality assessment via wavelet transform analysis. IEEE Transaction on Power Delivery. Apr. 1996;11(2):924-30.

Sensors, Controls, and Communications. U.S. Climate Change Technology Program—Technology Options for the Near and Long Term. Aug. 2005;1(3)12-4.

Solodovnik et al., Wireless Sensing and Controls for Survivable AC Zonal System, 2004;1-2. http://www.actapress.com/PaperInfo.aspx?PaperID=17901.

Sun et al., Fault-Tolerant Cluster-Wise Clock Synchronization for Wireless Sensor Networks, IEEE Transactions on Dependable and Secure Computing. 2005;2(3):177-89.

Sushama et al., Detection of power quality disturbances using wavelet transforms. Int J Computer. 2010;18(1):61-6.

* cited by examiner

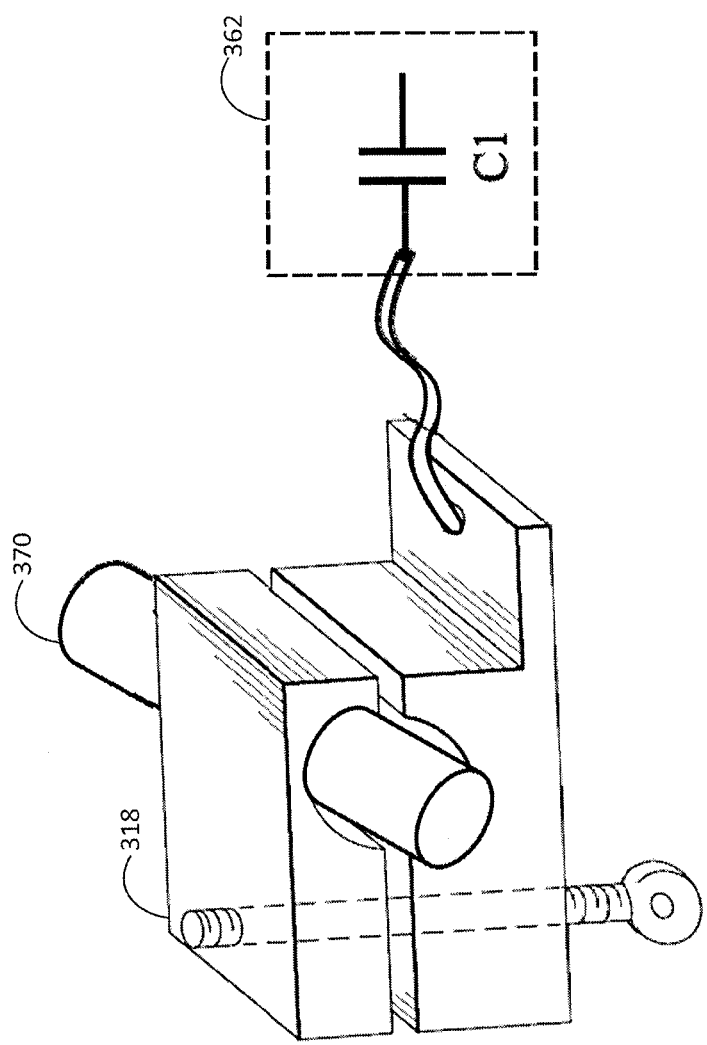

POWER EXTRACTION FOR A MEDIUM VOLTAGE SENSOR USING A CAPACITIVE VOLTAGE DIVIDER

RELATED APPLICATIONS

The present application claims priority under 35 U.S.C. § 119(e) to U.S. Provisional Application Ser. No. 62/043,640, entitled "POWER EXTRACTION FOR A MEDIUM VOLTAGE SENSOR USING A CAPACITIVE VOLTAGE DIVIDER" filed Aug. 29, 2014, which is incorporated herein by reference in its entirety.

BACKGROUND

Power lines are widely used in many settings to carry 50 Hz or 60 Hz alternating current to power the worldwide economy. They form an important part of the power distribution system, carrying power from generation facilities all the way to the locations where it is used. The power distribution system may include many types of power lines with high voltage lines used closer to the power generation facilities and lower voltage lines closer to the locations where the power is used, such as homes and businesses, for example. Medium voltage lines, carrying voltages on the order of 30,000 Volts, are used in between.

A power company may desire to obtain accurate measurements of power-related parameters of the power lines in order to manage and maintain the power lines. Such measurements include one or more voltage measurements. For example, voltage measurements may be combined with current measurements to determine, and then manage, the amount of reactive power throughout the power distribution system (e.g., by using the measured voltage and current to determine how to operate switched capacitor banks and/or other components of a power distribution system). As another example, voltage measurements may be used to detect power theft. Voltage measurements may also be used for other purposes. For example, voltage measurements may be used to detect faults in the power distribution system, or to monitor and/or minimize the voltage at the end customers for Conservative Voltage Reduction (CVR) purposes of saving energy.

Conventional approaches to measuring the voltage of a high voltage power line involve using metal (e.g., copper) wire(s) or potential transformers (PT) to electrically couple a voltage sensor to a voltage carrying (i.e., "hot") wire of the power line and a neutral wire of the power line in order to measure the voltage between the voltage-carrying wire and the neutral wire.

SUMMARY

Improved power line management is facilitated through a system that accurately measures voltage in a power distribution system. The system comprises one or more sensor units, each coupled to the power lines using a capacitive voltage divider to yield, at a sensor unit, a voltage in a measurable range. That voltage may also be used to power the sensor unit and/or other devices that may be coupled to it.

To obtain a voltage measurement of a high-voltage power line, in some embodiments, a sensor unit may be attached to a voltage-carrying wire (i.e., a phase) of a power line and may further be coupled to another wire (e.g., neutral wire or a phase) of the power line via a capacitor. The sensor unit may be configured to measure one or multiple electrical properties of the voltage-carrying wire including, but not limited to, voltage, current, frequency, harmonics, disturbances, partial discharge, faults, relative phase angle, power, direction of power, power quality, and power factor.

Accordingly, in some aspects, the invention may be embodied as a power line sensor unit configured for connection to a power line, such as an underground or an overhead power line. The sensor unit may comprise a first capacitor comprising a first electrode and a second electrode, a port configured to receive a connection to a second capacitor, where the first electrode of the first capacitor is connected to the port and the second electrode of the first capacitor is configured for connection to the power line. The sensor unit may further comprise a voltage sensor configured to measure a voltage at the port, whereby the measured voltage is indicative of the voltage of the power line.

In another aspect, the invention may be embodied as a method of measuring parameters of a medium-voltage power line with a sensor unit. The method may comprise the act of measuring a voltage at an electrode of a first capacitor (which may indicate the voltage across the first capacitor). The sensor unit may be configured such that the first capacitor is disposed within the sensor unit and is connected to a hot wire of the power line, where the first capacitor is coupled to a first electrode of a second capacitor. The second capacitor may be connected between the sensor unit and a neutral wire of the power line, and the first capacitor may be smaller than the second capacitor.

In yet another aspect, the invention may be embodied as a power line monitoring system for making at least one power-related measurement on a poly-phase line comprising at least a first wire and a second wire. The system may comprise a sensor unit attached to the first wire, where the sensor unit may comprise a first capacitor comprising a first electrode and a second electrode, the second electrode of the first capacitor being coupled to the first wire. The sensor unit may further comprise a voltage sensor configured to measure a voltage at the first electrode of the first capacitor, a second capacitor having a first electrode and a second electrode, the first electrode of the second capacitor being coupled to the first electrode of the first capacitor, and the second electrode of the second capacitor being coupled to the second wire.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 3c is a schematic illustration of a mechanical configuration for connecting a power line to a portion of a sensor unit.

DETAILED DESCRIPTION OF INVENTION

Figure 1:
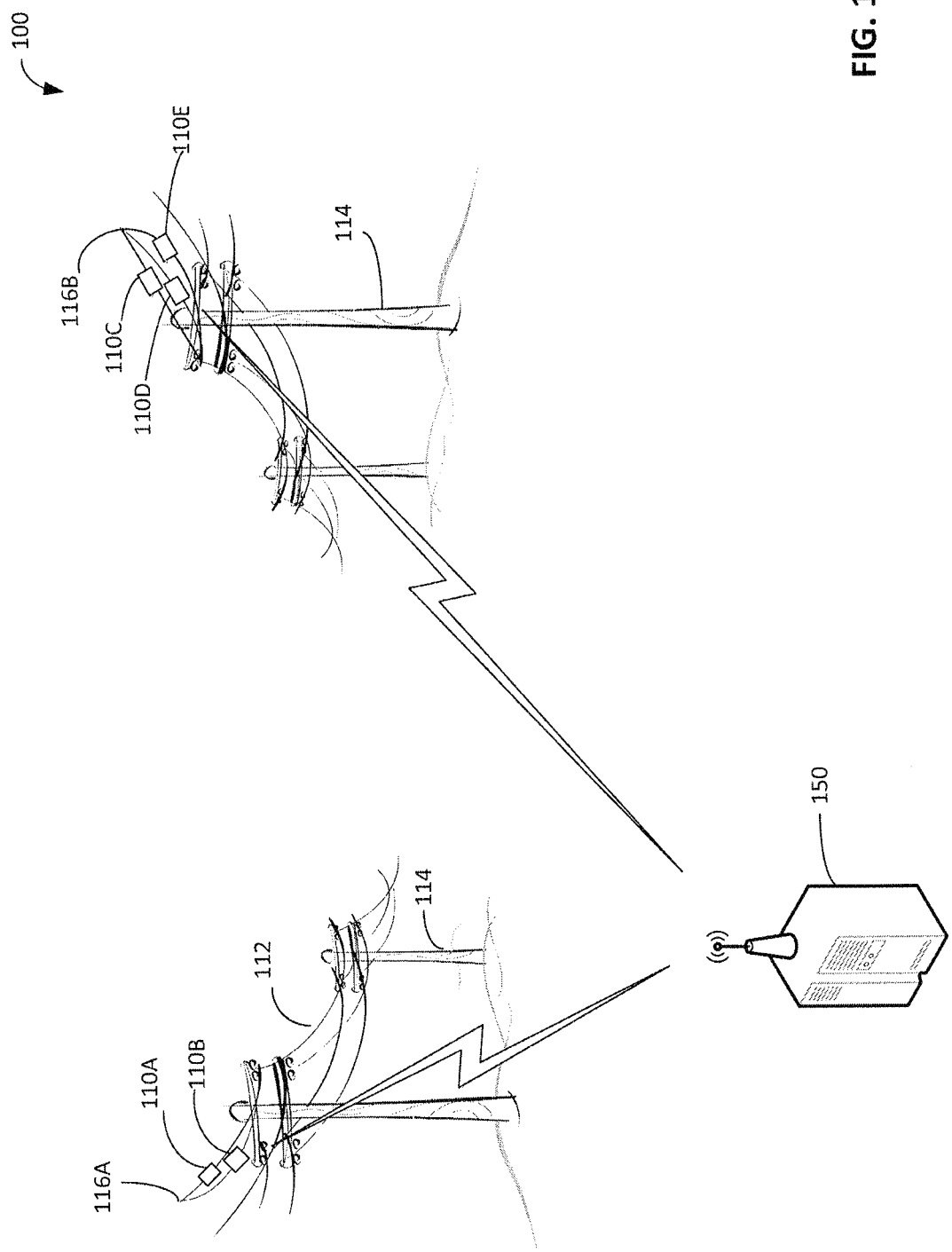
FIG. 1 is a schematic illustration of a power distribution system equipped with components for sensing and measuring at least one voltage-related property of a power line.

The inventors have recognized and appreciated that improved power line management may be achieved with a sensor unit with simple construction, yet can accurately measure line voltage. Such a device may be efficiently constructed and safely installed using commercially available components, such as capacitors designed for power line voltages.

The capacitors may be configured as a capacitive voltage divider. Voltage measurement circuitry may be connected to a tap of the voltage divider, allowing a relatively low voltage to be measured inside the sensor unit, even when the sensor is connected to a power line. Line voltages, on the order of 30,000 Volts, may be accurately determined by measuring the voltage at the tap, which may be on the order of 0 to 600 Volts.

To facilitate creation of a capacitive voltage divider, the sensor unit may include a first capacitor. The sensor unit may have a clamp that connects the sensor unit electrically, and in some embodiments physically, to a wire of the power line. For example, the sensor unit may be attached to the hot wire of a medium-voltage power line. Such a connection may also electrically connect an electrode of the first capacitor to the wire to which the sensor unit is attached. The sensor unit may also have a port to which another electrode of the first capacitor may be connected such that, when the sensor unit is attached to a wire of a power line, the first capacitor is connected between that wire and the port.

The port may be configured such that a second, larger capacitor external to the sensor unit may also be connected to the port. The second capacitor may be configured, such as with a clamp, for attachment to another wire of the power line. The second, larger capacitor may be connected to the neutral wire of the power line.

In some embodiments, the sensor unit may be sized and shaped for attachment to an overhead medium voltage power line. However, other embodiments may be sized for power lines in other voltage ranges, such as by changing the capacitance of one or both of the capacitors in the voltage divider. Moreover, in some embodiments, the sensor unit may be shaped for connection to an underground power line. In such an embodiment, the sensor unit may have an attachment mechanism that connects the sensor unit to the power line through a test access port.

Other measurement circuitry may alternatively or additionally be included within the sensor unit. Current measurement circuitry may be included. Such circuitry may operate with a Hall-effect sensor, Rogowski coil, current transformer, or any other suitable component to measure current. Alternatively or additionally, environmental sensors may be included in the sensor unit. For example, temperature or moisture sensors may be included.

In some embodiments, the use of a capacitive voltage divider to connect the sensor unit to the power line may also provide a source of power for the sensor unit and/or other nearby devices. Because the capacitive voltage divider may supply power even when no current is flowing on the power line, harvesting power from the capacitive voltage divider enables the sensor unit to draw power under a wide range of conditions, including at the end of a line, or when there is a fault on the line preventing current flow. To avoid inaccuracies in voltage measurement, techniques may be used to reduce the impact on the measured voltage from drawing power from the same point at which voltage is being measured.

Such techniques may include computational techniques under which the impact may be assessed, such as through a calibration process in which an offset is determined. The offset, correcting for changes in measured voltage caused by drawing power from the measurement point, may be applied to voltage measurements. As an example of another technique, the sensor unit may include a charge storage device, such as a battery or super capacitor. The charge storage device may be charged using the voltage from the capacitive voltage divider while no measurement is being made. To make a measurement, the charge storage device may be disconnected from the measurement point, but still connected to power the measurement circuitry.

The following figures provide examples of possible embodiments of sensors and systems employing such sensors. The embodiments illustrated in the figures are exemplary and not limiting of the invention.

FIG. 1 illustrates an environment in which the techniques described herein for sensing and measuring a voltage on a power line may be applied. In this example, FIG. 1 illustrates a power distribution network 100 that includes multiple overhead power lines 112. The overhead lines may be supported by towers and/or poles 114. As a result, each of the power lines 112 may have multiple segments, such as segments 116A and 116B, between the locations where the wires are attached to the towers and/or poles.

Sensor units may be attached to some or all of the power line segments. In the example illustrated in FIG. 1, sensor units 110A and 110B are shown as being attached to segment 116A of lines 112 and sensor units 110C, 110D, and 110E are shown as being attached to segment 116B of lines 112. In this example, sensor units are attached to a subset of the power line segments. Though, in some embodiments, a sensor unit may be attached to every power line segment; in other embodiments, sensor units may be selectively attached to power line segments. For example, sensor units may be selectively attached to power line segments that have characteristics representative of power line segments in a larger area (e.g., such line segments may be in locations having environmental conditions representative of environmental conditions of other line segments in a larger area). As another example, sensor units may be placed selectively on power line segments that are in locations carrying a greater risk of failure, such as windy locations, or posing a greater risk to people or objects below the power line segments if a failure should occur, as the case may be for power line segments spanning busy intersections. Thus, it should be appreciated that the number and locations of sensor units within power distribution network 100 is not critical to the invention.

A power line segment may comprise one or multiple wires. When a power line segment comprises multiple wires, the wires may be associated with different phases. For example, a power line segment may comprise three conductors; such a power line segment may be referred to as a three-phase line.

A sensor unit may be attached to one or multiple wires in a power line segment. A sensor unit may be attached to each of one, or two, or all three of the conductors in a three-phase line. For example, there may be two sensor units attached to a power line segment. In the example illustrated in FIG. 1, power line segment 116A is a three-phase line with sensor units 110A and 110B attached to different conductors. In the example illustrated in FIG. 1, power line segment 116B is a three-phase line with sensor units 110C, 110D, and 110E attached to different conductors in the power line segment.

It also should be appreciated that FIG. 1 shows a simplified representation of a power distribution system. A power distribution system may have many more poles and/or towers and many more power lines than illustrated. FIG. 1 illustrates power lines located overhead. In some embodiments, sensor units may be attached to power lines located underground (not shown), and FIG. 1 should be regarded as illustrative rather than limiting of environments in which a sensor unit may be installed. Moreover, FIG. 1 illustrates medium voltage lines. In some embodiments, sensor units may be preferentially attached to medium voltage lines because of the proximity of medium voltage lines to trees and other objects that could come into contact with the power lines. Medium voltage power lines also may be well suited for placement of sensor units because of the proximity of those lines to people or other objects that could be injured or damaged if a fault were to occur on such a line. Though, it should be appreciated that the specific type and structure of the lines to which sensor units are attached is not critical to the invention. Sensor units may be attached to any suitable type of line, including cables of various types.

Regardless of the numbers and locations of sensor units in the power distribution network, data collected at each sensor unit may be communicated to one or more computing devices for processing to determine a condition, on one or more of the power lines, indicating a current or predicted need for maintenance, for example. In the example of FIG. 1, data from the sensor units is wirelessly communicated to controller 150. In this example, controller 150 is illustrated as a single computing device collecting data from all of the sensors. Though, it should be appreciated that in a power distribution network spanning a large area, multiple computing devices may be used to collect and process data from the sensors. Any suitable one or more computing devices may be used to collect data from the sensors. The computing device may include components and/or data applications, such as databases, management systems, and/or short message service (SMS), that receive communications from and/or send communications to the sensor units. Additionally, one computing device may act as a centralized collection point, gateway, router or protocol converter to allow concurrent communication sessions with sensors from disparate computing devices. A power distribution system may include a centralized management system that includes controller 150, and in some embodiments, may include multiple controllers. Controller 150 may obtain data associated with measurements collected by one or more sensor units coupled to one or more power lines and provide correlation, analysis, and summarization of the data. For example, controller 150 may obtain data associated with a first set of measurements from a first sensor unit coupled to a first power line and data associated with a second set of measurements from a second sensor unit coupled to a second power line. Controller 150 may process and analyze the data associated with the first and second sets. Controller 150 may correlate and/or the first and second sets of data, although other types of suitable analysis may be performed.

If multiple devices are used, they may be located in one location or distributed across multiple locations. In the latter case, they may be connected through a network and/or organized hierarchically such that each computing device in the hierarchy may be configured to collect and process data gathered by a subset of sensor units. For example, one computing device may be configured to collect and process data from sensor units in one geographic region and another computing device may be configured to collect and process data from sensor units in another geographic region.

FIG. 1 also shows data being transmitted directly from each sensor unit to controller 150. In some embodiments, the data may be transmitted through one or more intermediary devices. Moreover, FIG. 1 illustrates wireless communication as an example of a communications mechanism that may be employed. Any suitable communication mechanism may be used. For example, in some embodiments, the data may be communicated in whole or in part over the power lines themselves. As a specific example, a sensor unit connected to a central data collection point, such as controller 150, through a power line, may transmit data over that power line. If a fault or other condition prevents or hinders communication over the power line, the sensor unit may transmit data wirelessly to the central location directly or indirectly through another sensor unit or other suitable intermediary device. Accordingly, it should be appreciated that the specific communications mechanism employed is not critical to the invention.

In some embodiments, different types of sensor units may be deployed as part of a monitoring system. The deployed sensor units may have different hardware capabilities and may be deployed throughout the power distribution network based on their capability. For example, in some embodiments, high-fidelity sensor units (e.g., sensor units capable of obtaining measurements at a high rate, having more processing power, etc.) may be deployed at one or more locations in the power distribution network. Additionally, multiple lower fidelity sensor units (e.g., sensor units capable of obtaining measurements at a lower rate than the high-fidelity sensor units, having less processing power than the high-fidelity sensor units, etc.). Such a hierarchical architecture may reduce the cost of a monitoring system by avoiding the cost associated with installing high-fidelity sensor units in locations where lower fidelity sensor units may be sufficient.

Each sensor unit may contain one or more types of sensors and circuitry for controlling the collection of data and transmission of that data for analysis. In some embodiments, each sensor unit may contain circuitry for processing the data prior to transmission. The processing may, for example, result in the encryption and/or compression of the collected data to reduce the amount of data transmitted. Any suitable type of data compression techniques may be used. Data may be compressed by using lossless or lossy compression techniques, or any suitable combination thereof. Data may be compressed, for example, by extraction of features or parameters characterizing signals measured by sensors including any time-varying signals measured by the sensors.

A further form of compression may entail transmission of samples of sensor data from time to time.

The times at which sensor data is transmitted may be periodic, randomized, and/or may be dynamically determined based on detection of changing conditions. For example, sensor data may be transmitted when there is a change in the environmental conditions (e.g., a snowstorm arrives, a tree falls, it becomes windy, etc.).

Figure 2:
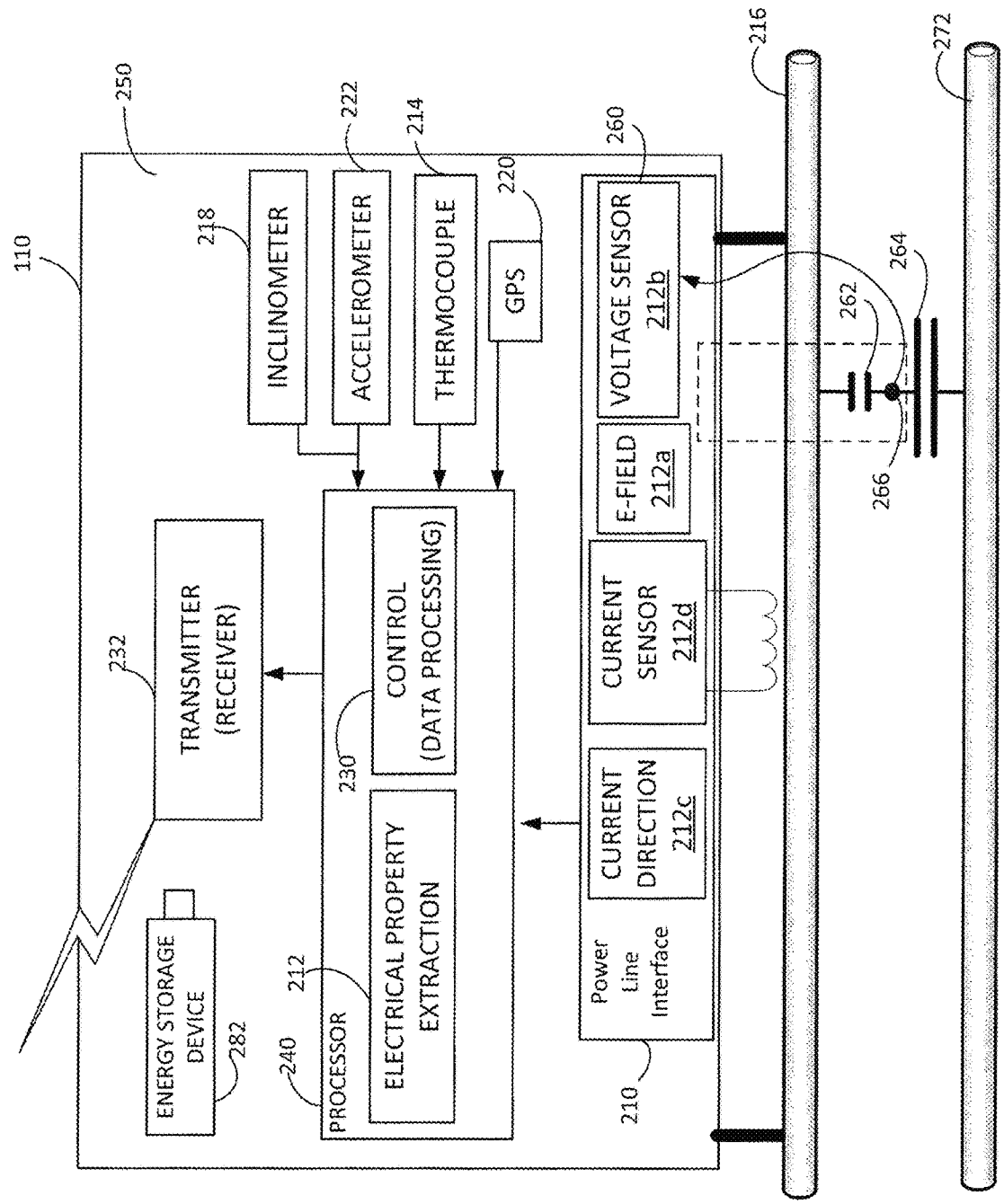
FIG. 2 is a functional block diagram of a sensor unit in accordance with some embodiments of a system for sensing and measuring at least one voltage-related property of a power line.

FIG. 2 illustrates an exemplary sensor unit 110. Here, sensor unit 110 is shown as being mechanically attached to line segment 216. The mechanical attachment is shown schematically in FIG. 2. Any suitable mechanical attachment technique, including clamps, adhesives or any other suitable mechanisms, may be used to attach each sensor unit to a line segment.

Each sensor unit may contain a housing 250 that is environmentally sealed. Such a housing may be manufactured with any suitable materials, including materials as are used in the art for components used in exterior locations, such as may be found in power distribution systems and/or telephone systems.

Sensors and control circuitry may be enclosed within the housing 250. One or more types of sensors may be included in a sensor unit. In the example illustrated in FIG. 2, sensors for measuring electrical and mechanical properties are both included in sensor unit 110. A power line interface 210 may be included to sense electrical properties on line segment 216. In some embodiments, power line interface 210 may include components for sensing those electrical properties without direct electrical connection to line segment 216. For example, capacitive or inductive coupling between power line interface 210 and line segment 216 may be employed.

Regardless of the specific mechanism used to electrically couple sensor unit 110 to line segment 216, sensor unit 110 may include circuitry 212 for extracting electrical properties of the line segment. To this end, circuitry 212 may include one or more sensors configured to extract electrical properties. For example, circuitry 212 may include electric field sensor 212a, voltage sensor 212b, current direction sensor 212c, and current sensor 212d. In some embodiments, voltage sensor 212b may be configured to detect voltage harmonics on the line, among other power-related properties. Though, it should be recognized that circuitry 212 may include and/or be coupled to any suitable sensor for determining electrical properties. Circuitry 212 may use techniques as are known in the art to determine electrical properties, such as voltage or current on line 216. In this way, circuitry 212, in combination with power line interface 210, may act as a sensor for electrical properties.

Other mechanical properties may be measured. For example, FIG. 2 shows that sensor unit 110 includes thermocouple 214. Thermocouple 214 may be configured to measure the temperature of line 216 and output a signal reflecting the temperature. Additionally or alternatively, thermocouple 214 may measure the outside ambient temperature. Yet further sensors may be configured to measure inertial properties of line segment 216. In this example, inclinometer 218 and accelerometer 222 are included for measuring inertial properties. Because these sensors are coupled through housing 250 to line segment 216, the inclination or acceleration measured by these sensors reflect conditions on line segment 216. The inertial sensors may be constructed using techniques as are known in the art. For example, such sensors may be manufactured using microelectronic manufacturing techniques. Though, it should be appreciated that the specific construction of the inertial sensors is not critical to the invention.

Regardless of how the sensors may be constructed, inclinometer 218 may output a signal representing a tilt of inclinometer 218, which, because of the mechanical coupling through housing 250 to line 216, may represent an amount of sag on line 216. Similarly, the output of accelerometer 222 may reflect acceleration on line 216. Other inertial sensors, such a sensor for velocity, alternatively or additionally may be included within sensor unit 110. Though, in some embodiments, other inertial measurements, such as velocity, may be derived from one or more of the inertial measurements made. For example, velocity may be derived through computations on outputs produced by accelerometer 222.

It should be appreciated that any of the above-mentioned sensors may be used to measure any of the above-described properties at any suitable time. Each sensor may measure properties that the sensor is configured to measure multiple times such that the sensor may produce a time-series of measurements of a time-varying characteristic. For example, thermocouple 214 may be configured to produce a time-series of temperature measurements. As another example, circuitry 212 may be configured to produce a time-series of measurements of a particular electrical property.

It should be appreciated that sensor unit 110 may comprise any of numerous other types of sensors in addition to or instead of the above-described sensors. For example, sensor unit 110 may comprise a GPS sensor such as GPS sensor 220 configured to obtain location and/or precision time information.

Regardless of the number and types of sensors within sensor unit 110, the outputs of the sensors may be collected by control circuitry 230, which in the embodiment illustrated is located within processor 240. Control circuitry 230 may be implemented using circuitry design techniques as are known in the art. Control circuitry 230, for example, may be implemented as a programmable logic device programmed to perform techniques as described herein. In other embodiments, control circuitry 230 may be a general-purpose microcontroller or other processor that may be programmed through instructions stored in nonvolatile memory. As another option, control circuitry 230 may be custom-designed circuitry such that it is programmed to perform the processing described herein based on the layout of circuit elements in the circuitry.

Regardless of the specific construction of control circuitry 230, control circuitry 230 may be configured to collect data from the sensors within sensor unit 110 and control transmitter 232 to transmit that data. In the example of FIG. 1, transmitter 232 may be configured to transmit data in accordance with a protocol recognized by controller 150. In some embodiments, control circuitry 230 may process the data collected from the sensors prior to transmission.

That processing may include data compression or other processing operations. As one example, the processing may include time-domain, frequency-domain, time-frequency domain, and/or time-scale domain analysis on time-varying outputs of one or more sensor units. For example, performing time-scale domain analysis may include performing a multi-resolution transformation via a wavelet transformation as is known in the art. In some embodiments, the processing may be performed in accordance with a time-invariant wavelet transformation. The transformation may be a discrete-time wavelet transformation. Such a transformation may generate one or more transform coefficient values representing a signal collected at the output of a sensor such that transmission of the coefficients may convey useful information in the signal, but may consume a much lower bandwidth upon transmission. Though, it should be appreciated that any other suitable signal processing techniques (e.g., Fourier techniques, Gabor analysis, discrete cosine transform, etc.) may be applied to the outputs of the sensors.

Alternatively or additionally, processing may include tagging data prior to its transmission. The data may be tagged in any suitable way, such as by including data to indicate the sensor unit at which the data was collected or the line segment for which the data is collected. Tagging may also indicate any suitable information associated with the sensor unit, such as the location of the sensor unit. Tagging may also indicate a time at which the data was collected or any other parameters useful in analyzing the data including, but not limited to, parameters indicating how the data may have been processed prior to transmission.

FIG. 1 shows data being sent uni-directionally, from sensor units to a computing device. In some embodiments, two-way communication may be supported. In those embodiments, transmitter 232 may be a portion of a radio that also operates as a receiver. In such embodiments, transmitter 232 may be a transceiver. Information received may represent commands to sensor unit 110 to trigger sensor unit 110 to perform functions that it is already configured to perform or to reconfigure sensor unit 110 to perform additional functions. Commands received over a communications link, for example, may trigger sensor unit 110 to collect and/or report sensor measurements. Though, the specific commands to which sensor unit 110 may respond are not critical to the invention, and sensor unit 110 may be configured to respond to any suitable commands.

Sensor unit 110 may include electrical components configured to facilitate measurements made by circuitry 212. These components may be active components, such as voltage or current measuring circuits, or passive components, such as capacitors, resistors, or inductors. For example, sensor 110 may include capacitor 262. Capacitor 262 may be located in any suitable place to facilitate measurements made by circuitry 212. Capacitor 262 may be housed within sensor 110 as indicated by the dashed box. Alternatively, capacitor 262 may be mounted outside the housing 250 of sensor 110, or located adjacent to or separate from the housing 250 of sensor unit 110.

Capacitor 262 may be connected to form a portion of a capacitive voltage divider. As shown, an electrode of capacitor 262 is connected to line 216. Another electrode of capacitor 262 may be connected to tap 266, to which an electrode of capacitor 264 is also connected. As shown, another electrode of capacitor 264 is connected to line 272. Line 272 may be a neutral wire and line 216 may be a hot wire, such that the capacitive voltage divider formed by capacitors 262 and 264 may provide a measurement of voltage between the neutral and hot wires. By appropriately sizing the capacitors, a nominal voltage on the order of 600 volts may be present at the tap 266 when the hot wire is a medium voltage line. Though such a configuration entails a voltage drop of approximately 29,000 Volts across capacitor 264, because that capacitor is external to the sensor unit, it may be sized for such voltages. Such capacitors are used in connection with power for power conditioning, and could be adapted for a measuring circuit as shown. A capacitor, with the capacitance required for a voltage divider as described above and capable of handling in excess of 600 Volts, may be of a size suitable for inclusion within the housing 250.

Tap 266 may serve as a measurement point of the capacitive voltage divider formed by capacitors 262 and 264. That tap may be implemented in any suitable way. In some embodiments, sensor unit 110 may include a port adapted for connection of an external capacitor, such as capacitor 264. Connections to tap 266 may be implemented by making connections to the port.

Power line interface 210 may include direct or indirect connections from the sensors to various measurement points, including tap 266. These connections may be hard-wired, but physical contact is not necessary depending on the type of sensor and type of measurement to be made. Measurement points may be located within the housing 250. Alternatively, connections may be made to measurement points outside of housing 250. For example, voltage sensor 212b may include a connection to a tap 266, which may be located within or outside the housing 250 as indicated by the dashed box.

It should be appreciated that FIG. 2 is a simplified representation of a sensor unit. Other components may alternatively or additionally be included. For example, FIG. 2 illustrates that sensor unit 110 includes at least one power source, one of which is illustrated as charge storage device 282 in FIG. 2. The at least one power source may serve as a standby power source. Charge storage device 282, for example, may be a battery or a super capacitor. However, any suitable power source alternatively or additionally may be included.

Figure 3A:
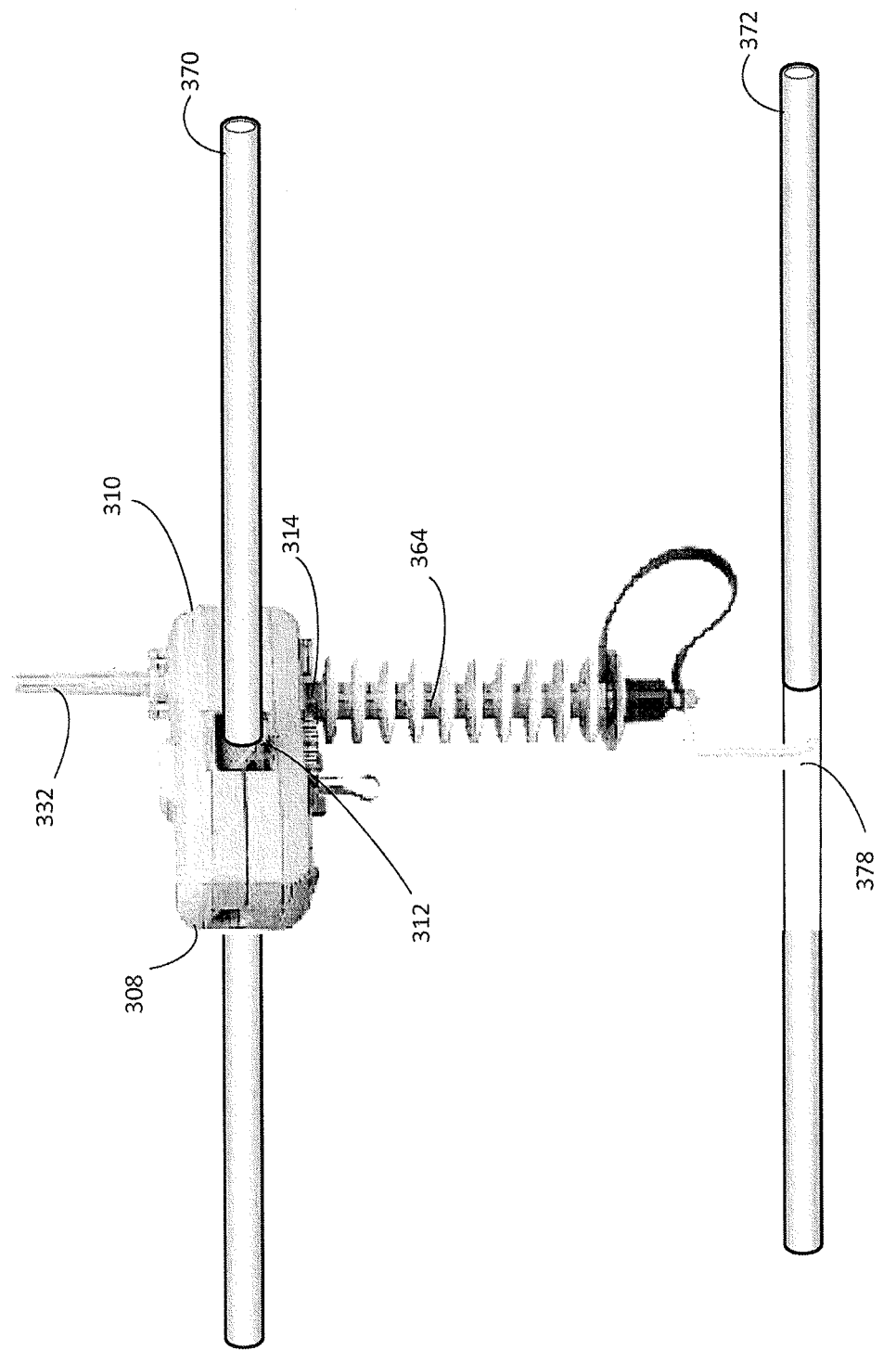
FIG. 3a is an illustration of a sensor unit in accordance with some embodiments of a system for sensing and measuring at least one voltage-related property of a power line.
Figure 3B:
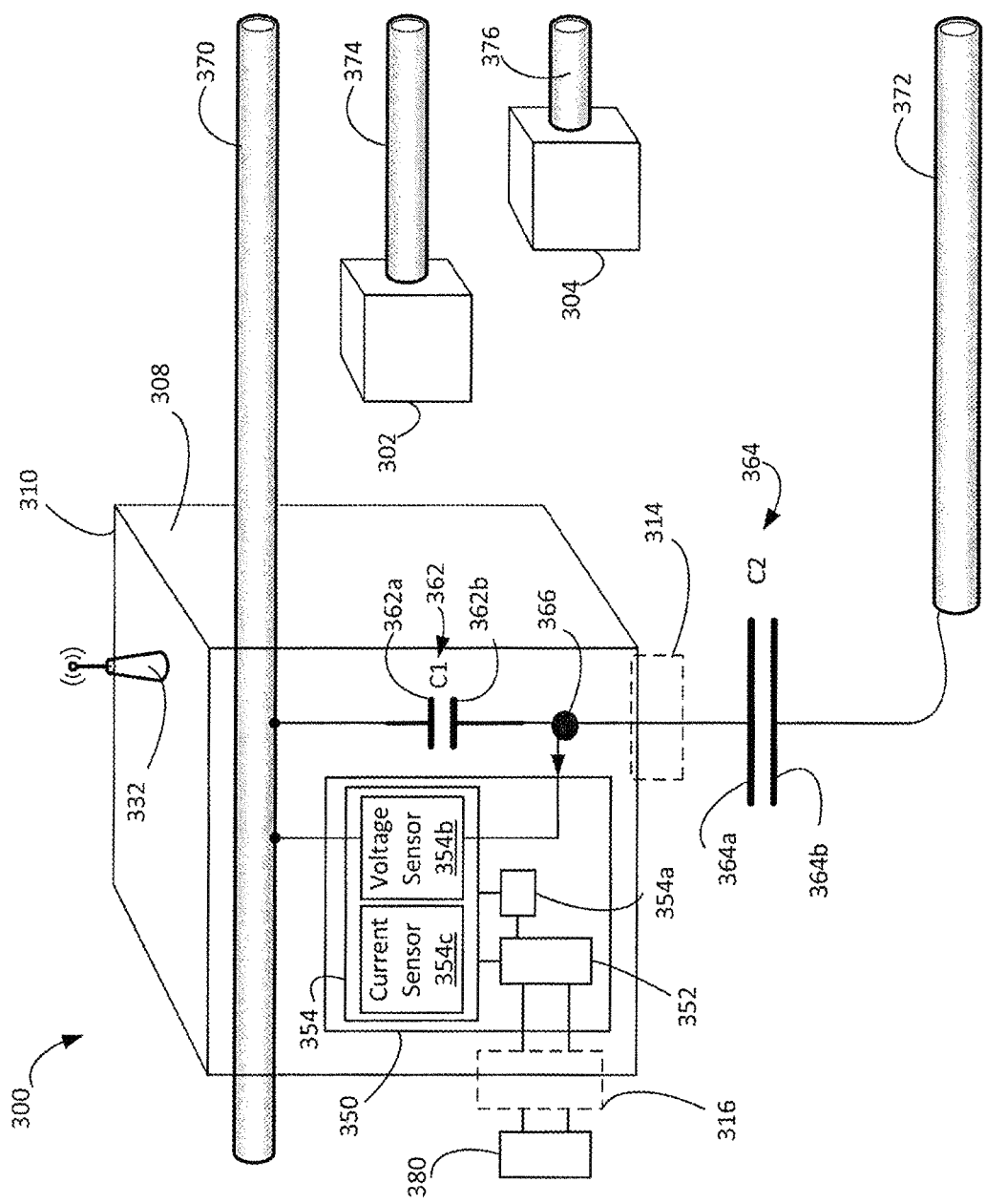
FIG. 3b is a schematic illustration of a sensor configuration in accordance with some embodiments of a system for sensing and measuring at least one voltage-related property of at least one phase of a power line.

FIG. 3a-3c illustrate an embodiment of a sensor unit 310 deployed in an overhead power distribution system. Sensor unit 310 may be attached to a hot wire 370 of a power line. Sensor unit 310 may include an opening 312 so that the wire can pass through the sensor unit housing 308, allowing for mechanical and electrical connection to the wire. Sensor unit 310 may be attached to the wire in any suitable way. For example, sensor unit 310 may be mechanically attached to the power line using a clamp 318, as illustrated in FIG. 3c. Additionally and/or optionally, clamp 318 may be made of any suitable conductive material to create an electrical connection between hot power wire 370 and sensor unit 310. For example, clamp 318 makes an electrical connection to the first electrode of a first capacitor 362 as illustrated in FIG. 3c.

Sensor unit 310 may include a plurality of ports in housing 308 for interfacing with components used in making measurements or other functions. For example, sensor unit may include port 314 through which a second, larger capacitor 364 is connected to measurement circuitry in side sensor unit 310. As another example, sensor unit 310 may contain a port for connecting external devices as indicated by the dashed box 316 in FIG. 3b. Such a port may be used, for example, to provide power to the external device. Sensor unit 310 may contain any number of additional ports to facilitate measuring electrical properties of power lines, communicating data and/or powering external devices.

Sensor unit 310 may also be attached to other power lines either directly or indirectly. For example, sensor 310 may be connected to a neutral power line 372 via a second capacitor 364. Capacitor 364 may be connected to neutral wire 372 in any suitable way. For example, conductive wire 378 may be used to connect an electrode of the second capacitor to the neutral wire 372.

FIG. 3a shows a single sensor attached to a single conductive wire. It should be appreciated that, in a power distribution system, multiple sensor units may be deployed. Multiple sensor units may be used to make measurements at multiple locations. Additionally, multiple sensor units may be used at a single location to measure electrical properties on different wires of a poly-phase line. In the embodiment illustrated in FIG. 3b, the power line is a three-phase power line consisting of conductive wires 370, 374 and 376, each representing one phase. Sensor units 310, 304 and 306 are each attached to hot conductive wires 370, 374 and 376, respectively.

FIG. 3b schematically illustrates an embodiment of a sensor system 300 for a medium-voltage, overhead power distribution system. Sensor unit 310 may have any suitable configuration to simply and accurately measure voltage-related properties of a medium-voltage power line. In the embodiment illustrated, measurement circuitry 354 includes one or more sensors for measuring these properties. For example, measurement circuitry 354 may include a voltage sensor 354b configured to sense and measure a voltage from hot wire 370.

Voltage sensor 354b may be configured in any suitable way to measure a voltage from hot wire 370. For example, voltage sensor 354b may be connected to a capacitive voltage divider to measure a portion of the voltage on hot wire 370. A capacitive voltage divider may be created in any suitable way to divide the voltage from the hot wire 370. In the embodiment illustrated, a capacitive voltage divider is created using a first, small capacitor 362 connected at electrode 362a to hot wire 370 and connected to a second, larger capacitor 364 at the other electrode 362b. The second capacitor is connected at electrode 364b to neutral wire 372 and connected at electrode 364a to electrode 362b of capacitor 362 via port 314. However, it should be appreciated that the second capacitor may be connected to any wire acting as a reference against which the voltage on hot wire 370 is measured.

In some embodiments, the second capacitor 364 may be larger than the first capacitor 362. The ratio of capacitances, for example, may be 10:1 or more. In other embodiments, the ratio may be on the order of 20:1, 30:1, 40:1, 50:1, 60:1, 70:1 or higher. However, it should be appreciated that the relative sizes of the capacitors may be modified depending on the desired output voltage. For example, for a medium-voltage power distribution system, this output voltage may be on the order of 600V. Capacitors 362 and 364 may be off-the-shelf components, and capacitor 364 may be designed for use with medium voltage lines.

In order to sense this voltage, voltage sensor 354b measures a voltage across the first capacitor with a first connection to hot wire 370 at electrode 362a and a second connection to electrode 362b at tap 366 between the two capacitors, as illustrated in FIG. 3b. This voltage signal can be used to measure voltage, and those measured voltages may be processed to reveal signal harmonics, one or more frequencies, disturbances, faults, and/or a relative phase angle between the voltage signal and other sensed signals, such as current signals.

Measurement circuitry 354 may also contain circuitry to measure current on hot wire 370. For example, current sensor 354c may be implemented using any suitable current sensor to sense a current signal on the wire. Possible current sensors may include, but are not limited to, a Hall-effect sensor, Rogowski coil or a current transformer. Current sensor 354c may also output information that indicates a direction and phase of a current signal from hot wire 370.

Measurement circuitry 354 may include any number of other sensors, such as environmental sensors (not shown). Examples include, but are not limited to, electric field sensors, GPS, accelerometers and/or temperature sensors.

Measurement circuitry 354 may also include circuitry for processing measured signals. Conventional processors (not shown) may be programmed to determine any number of power-related properties of hot wire 370 using sensed current and voltage signals. Examples of processed power-related properties include, but are not limited to: power, direction of power, direction of fault, detection of theft, power quality, and/or power factor.

Signals from multiple sensors may be processed to determine a power-related property representing the section of the power line the sensor is associated with. For example, signals measured from sensor units 310, 304 and 302 may be combined during the analysis of the power-related properties. The sensor units may communicate in any suitable way to enable the measurements from multiple sensor units to be processed together. Sensor units, for example, may communicate with each other such that one or more of the sensor units receives measurements made at one or more other sensor units. Alternatively or additionally, one or more sensor units may communicate with a central station, and processing may be performed at the central station. Sensed and/or processed signal data may be transmitted in any suitable way. In FIG. 3b, data is transmitted via transmitter 332 and may be collected by a controller 150 (FIG. 1) or other suitable component.

Measurement circuitry 354 may be configured to be powered in any suitable way. In the embodiment illustrated, the measurement circuitry may be powered via power harvesting unit 354a. Power harvesting unit 354a may include any suitable mechanism to draw energy from the power line to which the sensor unit is attached. In some embodiments, it may draw power from across capacitor 362. However, in other embodiments, it may include a coil inductively coupled to the power line or other suitable inductor. The harvested energy may supply power unit 352.

Power unit 352 may include any suitable energy storage device, for example, a battery or a super-capacitor, and power electronics known in the art to facilitate the charge transfer. Power unit 352 may be charged in any suitable way. For example, power unit 352 may be connected across the first capacitor 362 with one connection at the hot wire 370 and a second connection at the measurement tap 366 of the capacitive voltage divider. In this way, power unit 352 may still be powered even if there is no current flow on the line, for example, in case of a fault.

Power unit 352 is not restricted to powering the measurement circuitry and may also provide power to one or more devices external to the sensor unit. External device 380 may be a device that requires constant power, such as a radio. In the embodiment illustrated, external device 380 is physically connected to sensor unit 310 via port 316 and has a first connection to a first polarity of power unit 352 and a second connection to a second polarity of the power unit 352. In some embodiments, the external device 380 may be another sensor unit without power harvesting capability or may have power harvesting capability, but may use power from power unit 352 for redundancy and fault tolerance.

Figure 4:
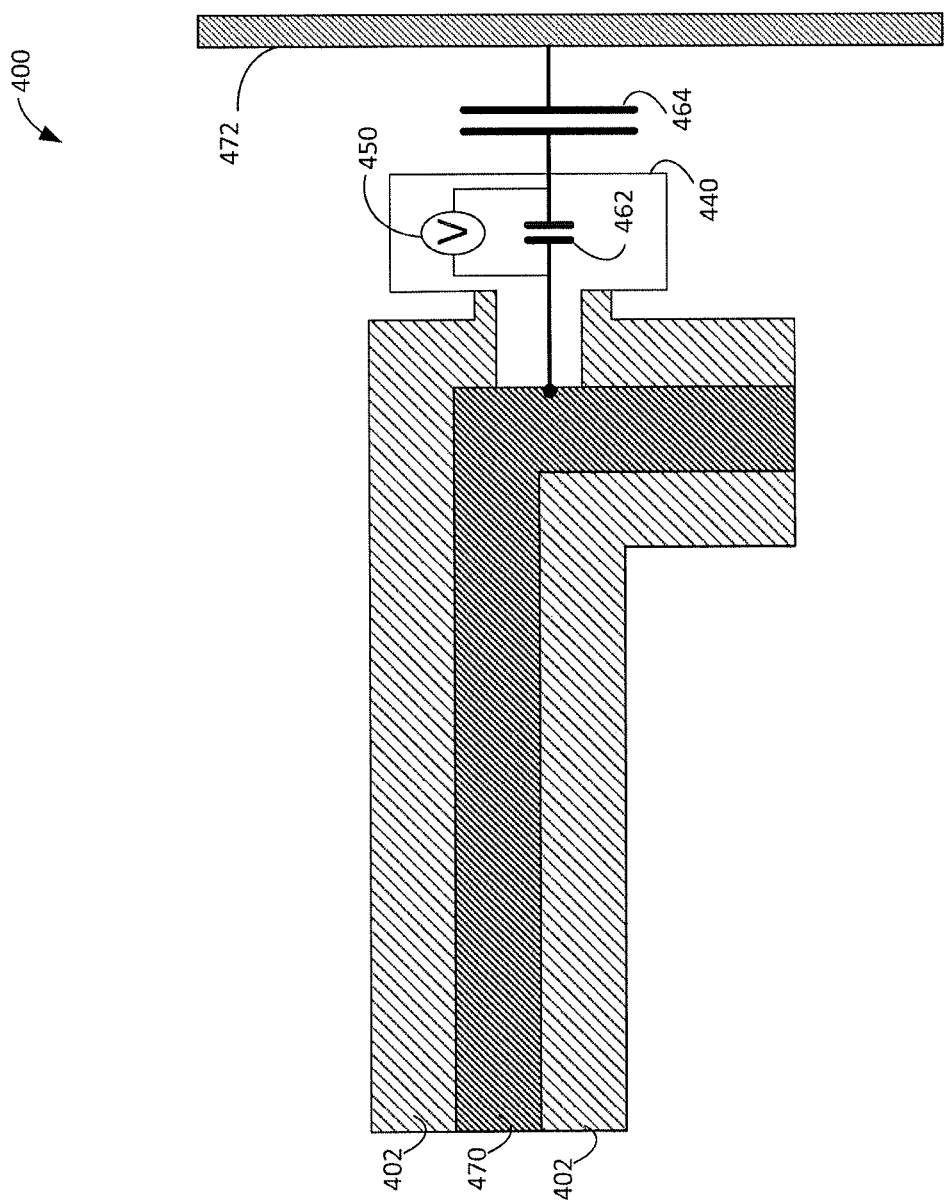
FIG. 4 is a schematic illustration of a sensor configuration in accordance with some embodiments of a system for sensing and measuring at least one voltage-related property of an underground power line.

As noted above, FIG. 3c illustrates an attachment mechanism by which a sensor unit may be attached to an above ground wire. A sensor unit, however, may be coupled to any suitable type of power line. FIG. 4 illustrates an embodiment of an underground sensor system 400. In the embodiment illustrated, sensor unit 440 is attached to an underground power line 470. In this example, the portion of the underground power line illustrated includes an elbow, which may be implemented using components as are known in the art. In this example, the elbow includes a test access port. Sensor unit 440 is configured for easy incorporation into an underground power distribution system. In this example, sensor unit 440 is sized to fit at least partially within a test access port on the medium voltage underground line. Sensor unit 440 measures voltage on conductor 114.

Here, sensor unit 440 is inserted in an opening in an insulative covering 402 on the power line. In this example, that opening may be a test access port. As shown, sensor unit 440 at least partially fits within the test access port. The portion within the test access port may include a connection to an electrode of a first, small capacitor 462. Other components of the sensor unit, such as the first capacitor, voltage sensor, and processing circuitry, such as those shown in FIG. 2, FIG. 3b and FIG. 5 may be located outside of the test access port. Other components of the sensor system 400 may include a second, larger capacitor 464 connected to the small capacitor and located outside the sensor unit. The second capacitor 464 may be connected to a neutral power line 472. The small and large capacitors may have a ratio as described above, or any other suitable ratio. The capabilities and components of the sensor system for underground use may be as described above for an above-ground power line.

The components of sensor system 400 may be arranged in any suitable way to create a simple underground sensor configuration. It should be appreciated that the illustration in FIG. 4 is a simplified representation of an underground sensor unit and system. Other components may alternatively or additionally be included to facilitate an underground power line measurement.

Figure 5:
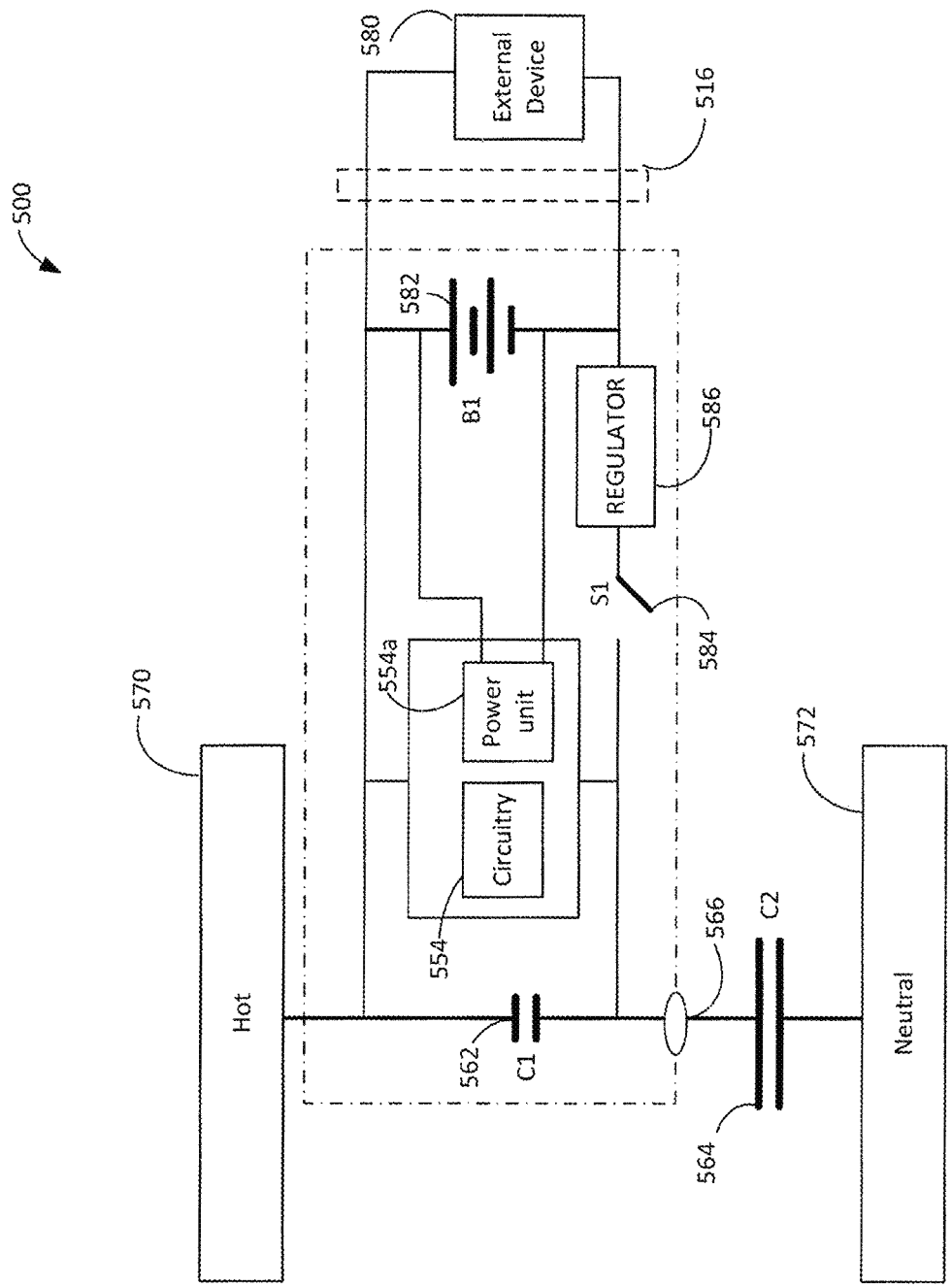
FIG. 5 is a schematic illustration of a sensor configuration in accordance with some embodiments of a system for sensing and measuring at least one voltage-related property of a power line.

FIG. 5 schematically illustrates a power source configuration for sensor system 300. As described above, the electronic components of sensor system 300 may be configured to derive power from the power line. In this example, power is capacitively coupled from the hot conductor 570 using circuit 500. In the embodiment illustrated, a portion of the power from hot conductor 570 may be accessed across a first capacitor 562 such that power may be drawn from conductor 570 even if no current is flowing on the conductor. In some embodiments, power may be inductively coupled from a conductor via an inductor.

Power coupled from first capacitor 562 may charge a storage device 582. As an example, the storage device may be a battery or a super capacitor. Here, that power may be coupled through regulator 586 to provide an appropriate voltage or power of other characteristics. That power may then be coupled to circuitry 554 and other active components. Circuitry 554 may include a voltage sensor and/or a current sensor. Alternatively or additionally, circuitry 554 may include a processor, which may be programmed to execute control and/or signal processing algorithms. Circuitry 510 also may include a transceiver and/or other suitable communication circuitry. Additionally, the power source may also be configured to provide power to one or more external devices attached to sensor unit 310. In the embodiment illustrated, external device 580 is connected to storage device 582 via port 516.

Powering measurement circuitry and/or storing charging a charge storage device from the power line may impact the voltage on the power line. In some embodiments, the impact of the voltage on the power line from harvesting power may be undesirable. Accordingly, the charging circuitry may be isolated from the power line while a measurement of the voltage or other property of that line is being made. During the measurement, the measurement circuitry may be powered from the charge storage device.

Any suitable isolation techniques may be applied to circuit 500 to manage the power drawn from first capacitor 562 to ensure accurate voltage measurements. In this example, an isolation switch 584 may be used to isolate capacitor 562 from storage device 582 while voltage measurements are taken. Isolation switch 584 may be arranged in circuit 500 such that when closed, storage device 582 is connected to first capacitor 562 via tap 566. When the switch is opened, storage device 582 is disconnected from first capacitor 562 at tap 566 but remains connected to deliver power to circuitry power unit 554a and/or external device 580. Isolation switch 584 may be controlled in any suitable way. For example, isolation switch 584 may be controlled by a processor or other suitable control circuitry. An isolation switch may be used to isolate other components used to draw power from a power line. In embodiments where power is drawn inductively via an inductor, an isolation switch may be used to isolate the inductor.

In other embodiments, circuit 500 may use other techniques to ensure accurate voltage measurements are taken without an isolation switch. For example, tap 566 may not be isolated from the storage device 582 which may draw power during a voltage measurement. Rather, computational techniques may be used to ensure accurate measurements when the measurement point and storage device are not isolated.

Figure 6:
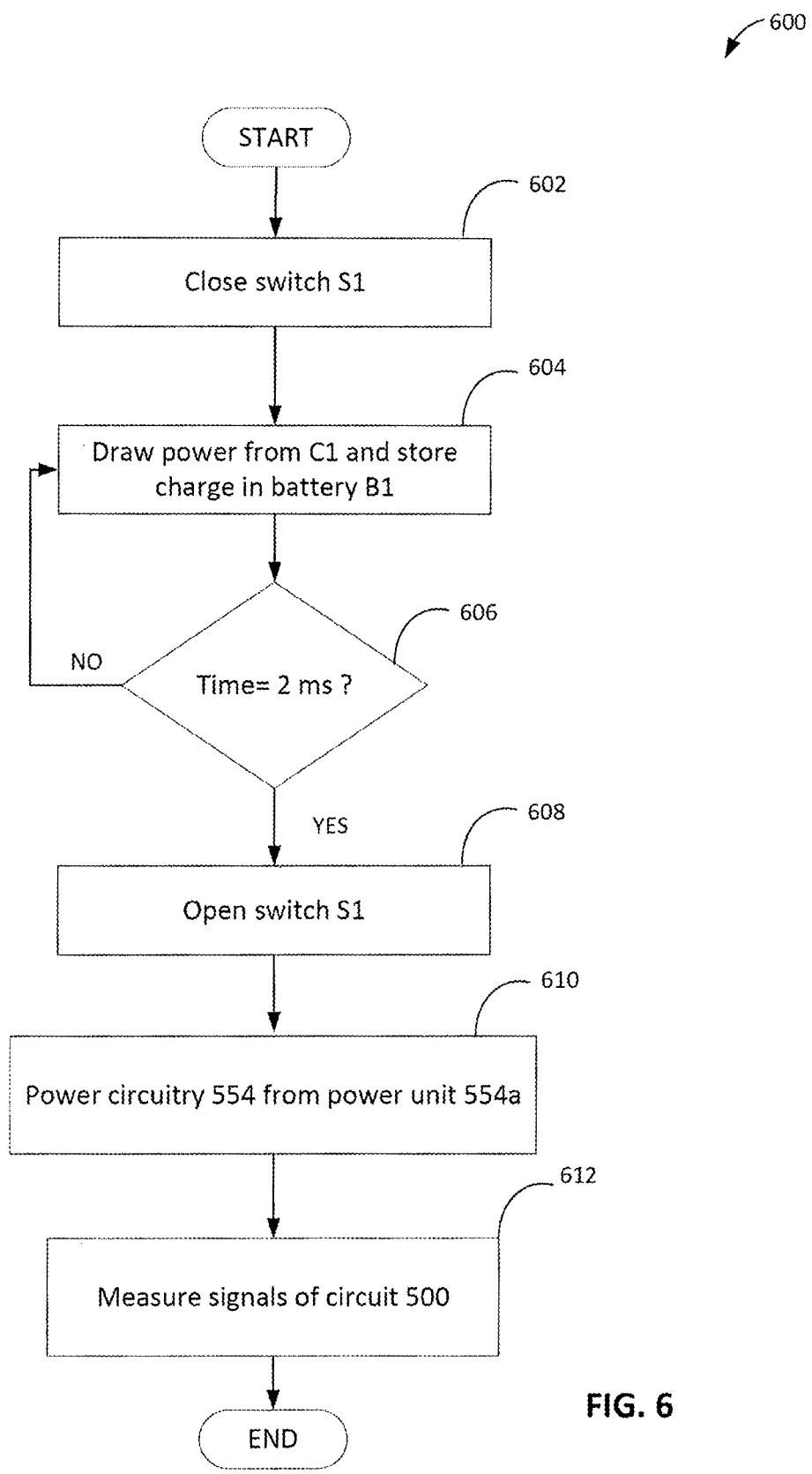
FIG. 6 is a flowchart of an illustrative process in accordance with some embodiments for managing power harvesting from a power line while measuring at least one power-related property of a power line.
Figure 7:
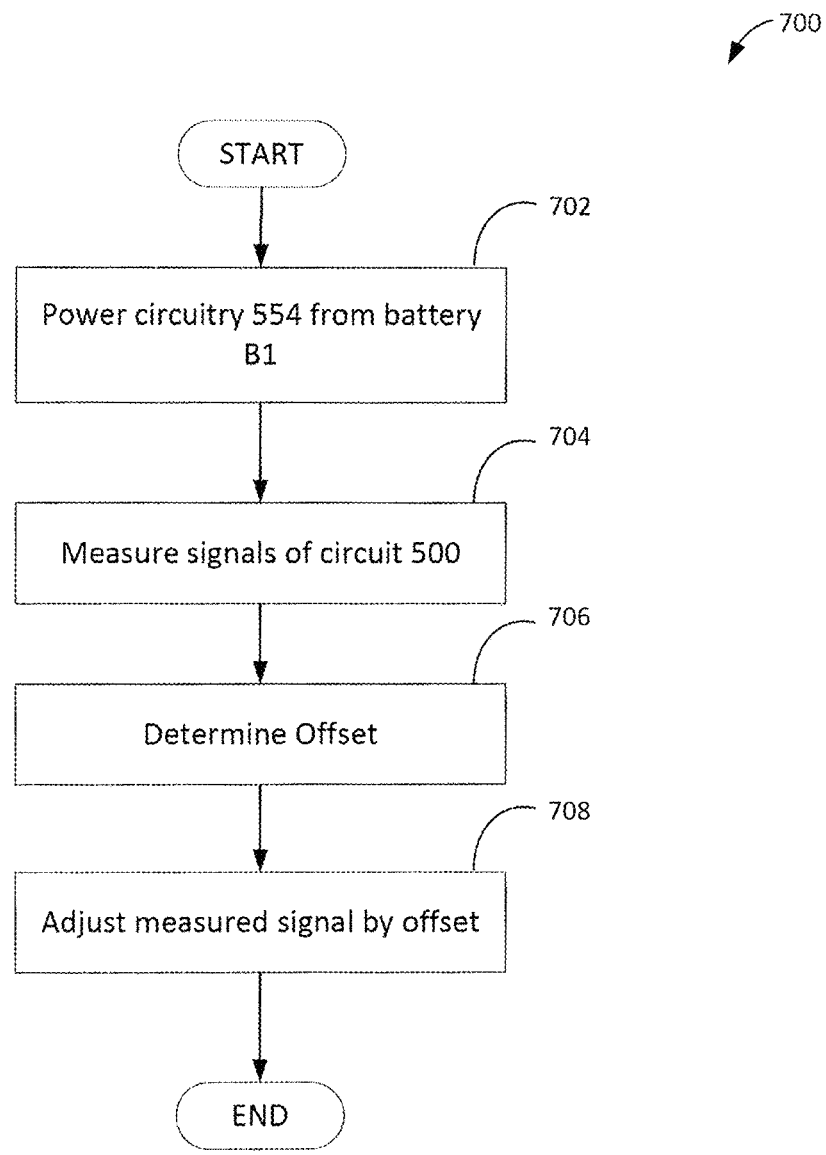
FIG. 7 is a flowchart of an illustrative process in accordance with some embodiments for compensating for the impact of power harvesting from a power line while measuring at least one power-related property of the power line.

FIGS. 6 and 7 show flowcharts of illustrative processes 600 and 700, respectively, for maintaining accurate voltage measurements while drawing power from a power line. Processes 600 and 700 may be executed by any sensor unit and, for example, may be performed by sensor unit 310 described with reference to FIG. 3a-3b. In particular, in some embodiments, some or all of the acts of processes 600 and 700 may be performed by control circuitry 230 described with reference to FIG. 2.

Process 600 begins in act 602, where a sensor unit executing the process may close a switch S1 in any suitable way using components known in the art. For example, sensor unit 310 may close isolation switch 584 in circuit 500 using regulator 586. Closing switch 584 connects storage device 582 to the first capacitor 562 at tap 566.

Next, process 600 proceeds to act 604, where power may flow into a storage device 582 in any suitable way. For example, power may flow from first capacitor 562 to storage device 582 in circuit 500.

Power draw from the first capacitor 562 may be controlled in any suitable way to ensure accurate voltage measurements. For example, power may be drawn for a limited period of time to ensure that the voltage on capacitor 562 does not change appreciably during a measurement. In act 606, control circuitry limits the power draw to 2 ms. It should be appreciated that 2 ms is an example only, and any suitable duration of power flow may be used. For example, the power draw periods may be seconds or minutes, interrupted by short intervals during which measurements are made. During the power draw periods, signal measurements may be halted. For example, no voltage measurements are taken at tap 566 during the 2 ms power draw period. After the power draw period expires, power draw ceases and measurements may start again.

Next, process 600 proceeds to act 608, where switch S1 may be opened in any suitable way. For example, as described above for closing switch 584, switch 584 may be opened using similar circuitry and methods. Opening switch 584 isolates storage device 582 from the first capacitor 562 at tap 566.

Next, process 600 proceeds to act 610, where circuitry 554 may be powered in any suitable way. For example, power unit 554a is still connected to storage device 582 when switch 584 is open and may provide power to circuitry 554.

Next, process 600 proceeds to act 612, where circuitry 554 may accurately measure signals of circuit 500 in any suitable way. For example, voltage sensor 354b may measure the voltage at tap 566 to determine a voltage level on hot conductor 570 while storage device 582 is in an isolated state. The voltage measurement may thus avoid measuring disturbances caused by power draw from storage device 582. Using the process 600, in which the charge storage device is recharged when a measurement is not being made on the line from which power is being harvested, circuit 500 may thus accurately measure voltage signals while powering the measurement circuitry from the power coupled from the power line. Other measurements may similarly be made in these measurement intervals. For example, current sensor 354c may measure a current signal from hot conductor 570. It should be appreciated that other sensor measurements not affected by the disturbances caused by storage device 582 drawing power may be made regardless of the isolated state of the storage device.

Alternatively, computational compensation techniques may be used to reduce the impact of inaccurate measurements by measuring a parameter of a line while power is being harvested from that line. For example, process 700 may not involve isolating the measurement components from the energy storage components. Instead, process 700 may involve measuring signals and drawing power from the same measurement points simultaneously, with computational steps to determine and correct for distortion caused by power harvesting.

Process 700 begins in act 702, where a sensor unit executing the process may draw power into storage device 582 in any suitable way. For example, sensor unit 310 may capacitively couple power from hot conductor 570 to storage device 582 in circuit 500 as illustrated in FIG. 5.

Next, process 700 proceeds to act 704, where signals are measured while power draw takes place. For example, a raw voltage signal is measured at tap 566. The raw voltage signal may contain disturbances from the power being drawn to storage device 582.

Next, process 700 proceeds to act 706, where processing circuitry assesses the impact of the disturbances on the voltage measurement. For example, measurement circuitry 554a may include processing circuitry, which calibrates the voltage measurement to determine deviations from an expected measurement. Such calibration, for example, may entail measuring a voltage on a power line with and without drawing power from the line to power the measurement circuitry. Any difference in the measured values may indicate the impact of drawing power from the measured line. This value may be different for different lines or different measurements. For example, measurement circuitry may have a greater impact on a medium voltage line than on a higher voltage line. Accordingly, calibration may entail determining multiple values representing the impact of the power drawn under multiple scenarios. Processing at block 706 may entail selecting the appropriate value from a pre-stored table.

Calibration may be performed prior to deployment of the sensor unit, or upon installation of the sensor unit, or at other times while the sensor unit is deployed. While FIG. 7 illustrates that an offset is computed as part of correcting a measurement, it should be appreciated that the calibration process making available values for computing the offset may be performed at other times. The results of that calibration may be reflected by one or more calibration values stored in memory. In such an embodiment, processing at block 706 may entail selecting and/or reading the appropriate value from that calibration memory.

In other embodiments, the offset may be determined in other ways. For example, the impact of drawing power from the line being measured may be calculated. The amount of current drawn by measurement circuitry, for example, may be known. The impact on the voltage of a line based on that amount of current shunted from the line may be calculated based on a model of the properties of the line. However, it should be appreciated that the offset may be determined in any suitable way.

Regardless of how the offset is determined, process 700 may proceed to act 708, where the offset may be applied to the raw voltage measurement. For example, the offset may be subtracted from or filtered out of the raw voltage measurement to eliminate the disturbances in the voltage signal. The voltage measurement may then be used in any suitable way, including in combination with current measurement to ascertain power-related parameters on the line.

Having thus described several aspects of at least one embodiment of this invention, it is to be appreciated that various alterations, modifications, and improvements will readily occur to those skilled in the art.

For example, embodiments are described in connection with a power distribution system used to deliver power from generation facilities to consumers of that power. However, the techniques described herein may be applied to transmission and distribution conductors in any other suitable setting. For example, techniques described herein may be used to obtain measurements of electrical properties of power lines used by the railway and streetcar industries or of high-voltage conductors used in subway systems.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein. Accordingly, the foregoing description and drawings are by way of example only.

The above-described embodiments of the present invention can be implemented in any of numerous ways. For example, embodiments involving computation or computerized control may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Additional output devices may include other operational support systems used by a utility to monitor and control their network. Examples of the uses of output from this system could be control of voltage regulators, control of capacitor banks, power consumption data for billing systems, output into outage management systems, or Historians, or output into fault location isolation and restoration (FUR) systems. The computer may also provide concentration of data from multiple sensors along with the necessary protocol conversion to support interfaces into these other operational support systems that may include proprietary data interfaces or industry standard protocols such as DNP-3 or IEC 61850. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, aspects of the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A power line sensor unit configured for connection to a power line, the sensor unit comprising:
    a housing;
    a first capacitor disposed within the housing; the first capacitor comprising a first electrode and a second electrode;
    at least one port, defined by a wall of the housing, configured to receive a connection to a second capacitor external to the housing, wherein the first electrode of the first capacitor is connected to the port and the second electrode of the first capacitor is configured for connection to the power line;
    a voltage sensor configured to measure a voltage at the port, whereby the measured voltage is indicative of the voltage of the power line; and
    a power unit comprising a power harvesting circuit engaged to a charge storage device; wherein the power unit is the sole power source for the sensor unit.

2. The power line sensor unit of claim 1, further comprising:
    a transmitter, a receiver, or a transceiver;
    a processor, configured to:
        receive an output of the voltage sensor;
        generate information indicative of a power-related parameter of the power line based on the received output; and send the generated information through the transmitter, receiver or transceiver.

3. The power line sensor unit of claim 2, wherein the transmitter, receiver or transceiver communicate with a centralized management system of a power distribution system, wherein the power distribution system comprises:
a plurality of power lines; and
a plurality of sensor units configured to collect measurements for at least one power line of the plurality of power lines, wherein the plurality of sensor units includes a first sensor unit coupled to a first power line and a second sensor unit coupled to a second power line, and wherein the management system comprises:
at least one controller configured to:
obtain data associated with a first set of one or more measurements collected by the first sensor unit and data associated with a second set of one or more measurements collected by the second sensor unit; and
provide correlation, analysis, and summarization of the data.

4. The power line sensor unit of claim 1, further comprising:
a current sensor disposed within the sensor unit and configured to measure a current signal from the power line.

5. The power line sensor unit of claim 4, further comprising:
a transmitter, receiver or transceiver;
a processor, configured to:
receive outputs of the current sensor and the voltage sensor;
generate information indicative of a power-related parameter of the voltage line based on the received outputs; and
send the generated information through the transmitter or transceiver.

6. The power line sensor unit of claim 5, wherein:
the power-related parameter is one of voltage, current, power, frequency, power factor, direction of power and/or power quality.

7. The power line sensor unit of claim 1:
in combination with the second capacitor;
wherein:
the first capacitor is disposed within the sensor unit and wherein the first capacitor is smaller than the second capacitor.

8. The power line sensor unit of claim 1, wherein:
the sensor unit is configured for connection to an underground line.

9. The power line sensor unit of claim 1, wherein the power harvesting circuit is coupled to the first capacitor.

10. The power line sensor unity of claim 1, further comprising:
an additional power harvesting circuit coupled to the power line via an inductor.

11. The power line sensor unit of claim 9, further comprising:
a switch connected between the power harvesting circuit and the first electrode of the first capacitor; and
a control circuit for the switch, the control circuit configured to open the switch while the voltage sensor is making a measurement.

12. The power line sensor unit of claim 11, further comprising:
an second power line harvesting circuit coupled to the power line via an inductor;

a second switch connected between the second power line harvesting circuit and the inductor; and
a second control circuit for the second switch, the second control circuit configured to open the second switch while the voltage sensor is making a measurement.

13. The power line sensor unit of claim 1, wherein the second port is electrically coupled to the power harvesting circuit to provide a power connection to a device external to the sensor unit.

14. The power line sensor unit of claim 1, wherein:
the sensor unit further comprises a conductive clamp configured for attaching to the power line; and
the second electrode of the first capacitor is connected to the power line via the clamp.

15. A method of measuring parameters of a medium-voltage power line with a sensor unit, the method comprising:
measuring a voltage across a first capacitor, wherein:
the first capacitor is disposed within the sensor unit;
the first capacitor is connected to a hot wire of the power line;
the first capacitor is coupled to a first electrode of a second capacitor through a port of a sensor unit housing, the second capacitor being external to the sensor unit and connected between the sensor unit and a neutral wire of the power line, the first capacitor being smaller than the second capacitor.

16. The method of claim 15, wherein:
the sensor unit further comprises measurement circuitry; and
the method further comprises powering the measurement circuitry with power harvested from the power line via a voltage divider formed by the first capacitor and the second capacitor.

17. The method of claim 16, further comprising:
computing an offset based on impact of a voltage measurement from powering the measurement circuitry with power harvested from the power line; and
adjusting the measured voltage by the computed offset.

18. The method of claim 15, wherein:
the sensor unit further comprises measurement circuitry and a charge storage device; and
the method further comprises regulating charging current from the first capacitor to the charge storage device based on operating state of the measurement circuitry.

19. The method of claim 18, wherein regulating charging current comprises:
drawing power from the electrode of the first capacitor to charge the charge storage device during a first time period;
isolating the first capacitor from the charge storage device during a second period of time, the second period of time being different than the first period of time; and
measuring a voltage at the first capacitor during the second time period while powering the measurement circuitry from the charge storage device.

20. A power line monitoring system for making at least one power-related measurement on a poly-phase line comprising at least a first wire and a second wire, the system comprising:
a sensor unit attached to the first wire, the sensor unit comprising:
a housing;
a first capacitor disposed within the housing, the first capacitor comprising a first electrode and a second electrode, the second electrode of the first capacitor being coupled to the first wire; and a voltage sensor configured to measure a voltage across the first capacitor;

a second capacitor external to the housing, the second capacitor having a first electrode and a second electrode, the first electrode of the second capacitor being coupled to the first electrode of the first capacitor through at least one port defined by the housing, and the second electrode of the second capacitor being coupled to the second wire.

21. The power line monitoring system of claim 20, wherein the second capacitor has a capacitance that is 10-70 times greater than a capacitance of the first capacitor.

22. The power line monitoring system of claim 20, wherein:

the sensor unit further comprises a charge storage device configured to be recharged by a voltage across the first capacitor.

23. The power line monitoring system of claim 22, wherein:

the sensor unit is a first device;

the system further comprises a second device;

the second device is coupled to receive power from the charge storage device of the first device through a port in a housing of the first device.

24. The power line monitoring system of claim 22, wherein the power line is a medium voltage power line.

* * * * *